United States Patent
Kinoshita (10) Patent No.: US 8,419,251 B2
(45) Date of Patent: Apr. 16, 2013

(54) LIGHT EMITTING DEVICE AND METHOD FOR MANUFACTURING SAME, LIGHTING FIXTURE, AND LIGHTING SYSTEM

(75) Inventor: Junichi Kinoshita, Ehime-ken (JP)

(73) Assignees: Harison Toshiba Lighting Corp., Ehime (JP); Kabushiki Kaisha Toshiba, Tokyo (JP)

( * ) Notice: Subject to any disclaimer, the term of this patent is extended or adjusted under 35 U.S.C. 154(b) by 445 days.

(21) Appl. No.: 12/725,507

(22) Filed: Mar. 17, 2010

(65) Prior Publication Data
US 2011/0032724 A1 Feb. 10, 2011

(30) Foreign Application Priority Data
Aug. 10, 2009 (JP) .................... 2009-186068

(51) Int. Cl.
*F21V 8/00* (2006.01)
*F21V 21/26* (2006.01)
*G02B 6/26* (2006.01)

(52) U.S. Cl.
USPC ............. 362/558; 362/607; 362/26; 362/271; 362/84

(58) Field of Classification Search ............. 362/554, 362/555, 606, 607, 558, 84, 26, 29, 616, 362/271; 385/31, 129
See application file for complete search history.

(56) References Cited

U.S. PATENT DOCUMENTS

| | | | | |
|---|---|---|---|---|
| 5,810,463 A * | 9/1998 | Kawahara et al. | ........... | 362/601 |
| 5,854,705 A * | 12/1998 | Apte et al. | ........... | 359/196.1 |
| 6,337,946 B1 * | 1/2002 | McGaffigan | ........... | 385/146 |
| 6,594,417 B1 * | 7/2003 | Hulse | ........... | 385/31 |
| 7,097,339 B2 * | 8/2006 | Chou et al. | ........... | 362/612 |
| 7,264,367 B2 * | 9/2007 | Hulse | ........... | 362/84 |
| 7,496,265 B2 * | 2/2009 | Juni | ........... | 385/129 |
| 7,540,645 B2 * | 6/2009 | Kazakevich | ........... | 362/555 |
| 7,748,882 B2 * | 7/2010 | Inditsky | ........... | 362/551 |
| 7,855,763 B2 * | 12/2010 | Yuuki et al. | ........... | 349/62 |
| 2009/0040781 A1 * | 2/2009 | Ito | ........... | 362/554 |

FOREIGN PATENT DOCUMENTS

JP 2006-106212 A 4/2006

* cited by examiner

*Primary Examiner* — Peggy A. Neils
(74) *Attorney, Agent, or Firm* — Carrier Blackman & Associates, P.C.; Joseph P. Carrier; William D. Blackman (57) ABSTRACT

A light emitting device includes: a light emitting element; a substrate including a groove-like light guide extending along a first direction, emission light emitted from the light emitting element and introduced into the light guide being reflected by an inner wall surface of the light guide, spreading along the first direction, and being turned into upward light directed upward above the substrate; and a lens provided above the light guide and configured to collect the upward light and control light distribution characteristic in a plane generally perpendicular to the first direction.

11 Claims, 12 Drawing Sheets

FIG. 12

LIGHT EMITTING DEVICE AND METHOD FOR MANUFACTURING SAME, LIGHTING FIXTURE, AND LIGHTING SYSTEM

CROSS-REFERENCE TO RELATED APPLICATIONS

This application is based upon and claims the benefit of priority from the prior Japanese Patent Application No. 2009-186068, filed on Aug. 10, 2009; the entire contents of which are incorporated herein by reference.

BACKGROUND

1. Field

Embodiments of the invention relate generally to a light emitting device and a method for manufacturing the same, a lighting fixture, and a lighting system.

2. Background Art

Use of semiconductor light emitting elements in light emitting devices and lighting fixtures facilitates energy saving, lifetime extension, downsizing, and weight saving. Furthermore, it is also desirable to the environment because of no use of mercury and the like.

Therefore, there are increasing demands for small size, low profile, and light weight in applications such as headlights and other illumination devices and backlights of liquid crystal display devices.

JP-A 2006-106212 (Kokai) discloses an example technique for a backlight unit satisfying the reduction of power consumption and the enhancement of luminance. The backlight unit disclosed in this example includes light sources for emitting, respectively, red light, blue light, and green light, a first reflector for reflecting the light from the light sources toward an opening, and a second reflector for reflecting the light from the light sources to the other end of the housing.

In general, a surface-emitting element like LED chip emits light with a wide light distribution angle upward above its surface. To obtain higher luminance of the light output from the surface-emitting element with a wide light distribution angle, it is necessary to collect and collimate the light using a large lens and the like. Also, it is necessary to use a larger-size element because current density applied to the element must be reduced for higher brightness operation. In this example, the total emitting size of the three-color (RGB) surface-emitting light sources becomes much larger. Therefore, the collecting and collimating lens is much larger as well. Thus, this example does not sufficiently satisfy the requirements of high luminance and optical system downsizing at the same time.

SUMMARY

According to an aspect of the invention, there is provided a light emitting device including: a light emitting element; a substrate including a groove-like light guide extending along a first direction, emission light emitted from the light emitting element and introduced into the light guide being reflected by an inner wall surface of the light guide, spreading along the first direction, and being turned into upward light directed upward above the substrate; and a lens provided above the light guide and configured to collect the upward light and control light distribution characteristic in a plane generally perpendicular to the first direction.

According to another aspect of the invention, there is provided a lighting fixture including: a light emitting device including: a light emitting element; a substrate including a groove-like light guide extending along a first direction, emission light emitted from the light emitting element and introduced into the light guide being reflected by an inner wall surface of the light guide with spreading along the first direction and turned into upward light directed upward above the substrate; a phosphor-mixed layer provided above the light guide and capable of absorbing the emission light and emitting wavelength-converted light; and a lens provided above the phosphor-mixed layer and configured to collect the upward light and the wavelength-converted light and control light distribution characteristic of mixed light of the upward light and the wavelength-converted light in a plane generally perpendicular to the first direction; a light guide plate configured to guide the mixed light injected from one side surface; and an optical sheet capable of diffusing and emitting the mixed light emitted from an upper surface of the light guide plate.

According to still another aspect of the invention, there is provided a lighting fixture including: a light emitting device; the light emitting device including: a light emitting element; a substrate including a groove-like light guide extending along a first direction, emission light emitted from the light emitting element and introduced into the light guide being reflected by an inner wall surface of the light guide, spreading along the first direction, and being turned into upward light directed upward above the substrate; and a lens provided above the light guide and configured to collect the upward light and control light distribution characteristic in a plane generally perpendicular to the first direction; an actuator configured to vary tilt angle of the substrate; and an actuator driving circuit configured to drive the actuator.

According to still another aspect of the invention, there is provided a lighting system including: a lighting fixture including: a light emitting device including: a light emitting element; a substrate including a groove-like light guide extending along a first direction, emission light emitted from the light emitting element and introduced into the light guide being reflected by an inner wall surface of the light guide, spreading along the first direction, and being turned into upward light directed upward above the substrate; and a lens provided above the light guide and configured to collect the upward light and control light distribution characteristic in a plane generally perpendicular to the first direction; an actuator configured to vary tilt angle of the substrate; and an actuator driving circuit configured to drive the actuator; a sensor capable of detecting an image of an object irradiated with outgoing light from the lens; a light emitting element power supply circuit configured to supply a current to the light emitting element; and a control circuit configured to use the detected image to output to the light emitting element power supply circuit a light emitting element control signal for controlling the current and to output to the actuator driving circuit an actuator control signal for controlling illumination direction of the outgoing light.

According to still another aspect of the invention, there is provided a lighting system including: a lighting fixture including: a light emitting device including: a light emitting element; a substrate including a groove-like light guide extending along a first direction, emission light emitted from the light emitting element and introduced into the light guide being reflected by an inner wall surface of the light guide, spreading along the first direction, and being turned into upward light directed upward above the substrate; a phosphor-mixed layer provided above the light guide and capable of absorbing the emission light and emitting wavelength-converted light; and a lens provided above the phosphor-mixed layer and configured to collect the upward light and the wavelength-converted light and control light distribution characteristic of mixed light of the upward light and the wavelength-converted light in the plane generally perpendicular to the first direction; an actuator configured to vary tilt angle of the substrate; and an actuator driving circuit configured to drive the actuator; a sensor capable of detecting an image of an object irradiated with outgoing light from the lens; a light emitting element power supply circuit configured to supply a current to the light emitting element; and a control circuit configured to use the detected image to output to the light emitting element power supply circuit a light emitting element control signal for controlling the current and to output to the actuator driving circuit an actuator control signal for controlling illumination direction of the outgoing light.

According to still another aspect of the invention, there is provided a method for manufacturing a light emitting device, including: forming a electrode pattern, a groove-like light guide, and a separation groove on a wafer-like substrate; mounting a light emitting element to the substrate to electrically connect an electrode of the light emitting element and the electrode pattern, emission light of the light emitting element being capable of being introduced into the light guide; forming a phosphor-mixed layer on a first major surface of a transparent substrate and providing a lens on a second major surface side of the transparent substrate opposite to the first major surface; laminating the substrate to the first major surface side of the transparent substrate to make the light guide opposite to the phosphor-mixed layer; and cutting and separating the substrate and the transparent substrate along the separation groove.

DETAILED DESCRIPTION

Embodiments of the invention will now be described with reference to the drawings.

Figure 1:
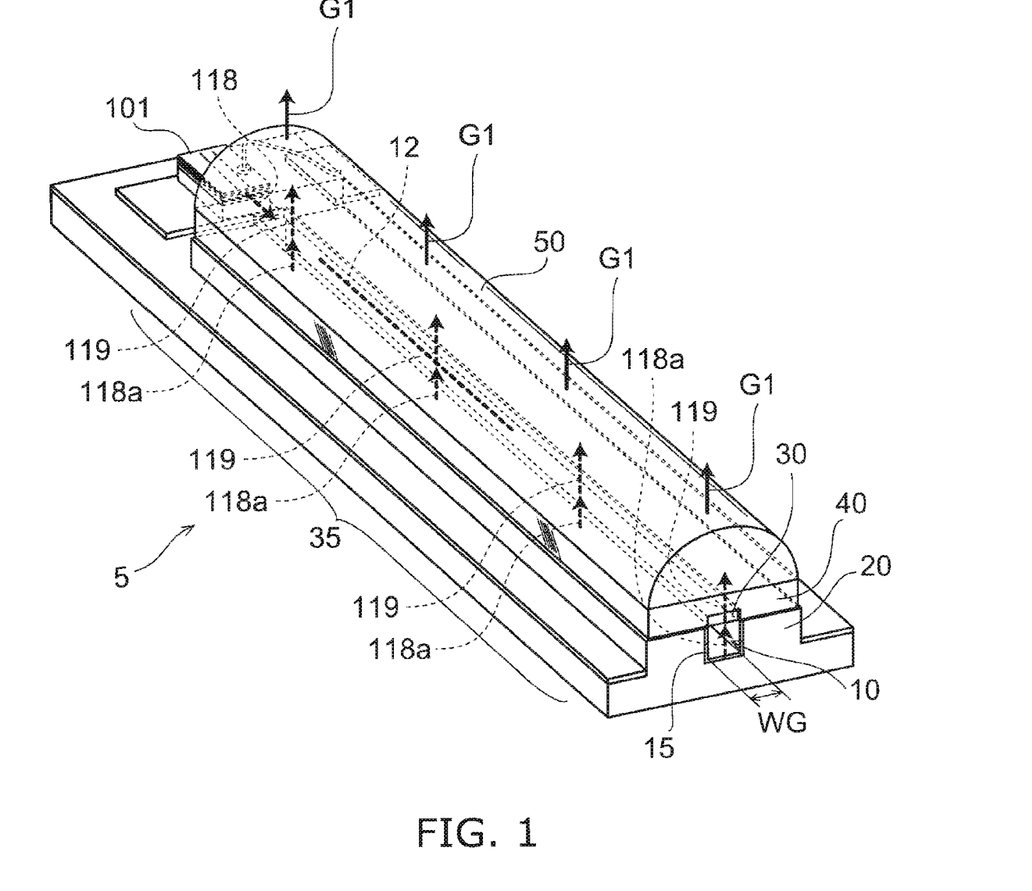
FIG. 1 is a schematic perspective view of a light emitting device according to a first embodiment.

FIG. 1 is a schematic perspective view of a light emitting device according to a first embodiment of the invention.

A light emitting device 5 includes a substrate 20 including a light guide 10 in the form of a groove which extends along a first direction 12, a light emitting element 101, and a lens 50 provided above the light guide 10.

The emission light 118 from the light emitting element 101 is introduced into one end portion of the light guide 10. While spreading along the first direction 12, the introduced emission light 118 is reflected by the inner wall surface (side surface and/or bottom surface) of the light guide 10 and turned into upward light 118a directed upward above the substrate 20. The lens 50 is provided above the light guide 10 and can control light distribution characteristics in the plane generally perpendicular to the first direction 12 by collecting the upward light 118a. It is noted that the structure of the light emitting device 5 excluding the light emitting element 101 is hereinafter referred to as an optical section 35.

The substrate 20 is illustratively made of Si, and the width WG of the light guide 10 is 500 μm or less. If the inner wall surface of the groove-like light guide 10 is provided with a high reflector 15 such as Al or Ag, it effectively reflects the emission light incident on the light guide.

Figure 2:
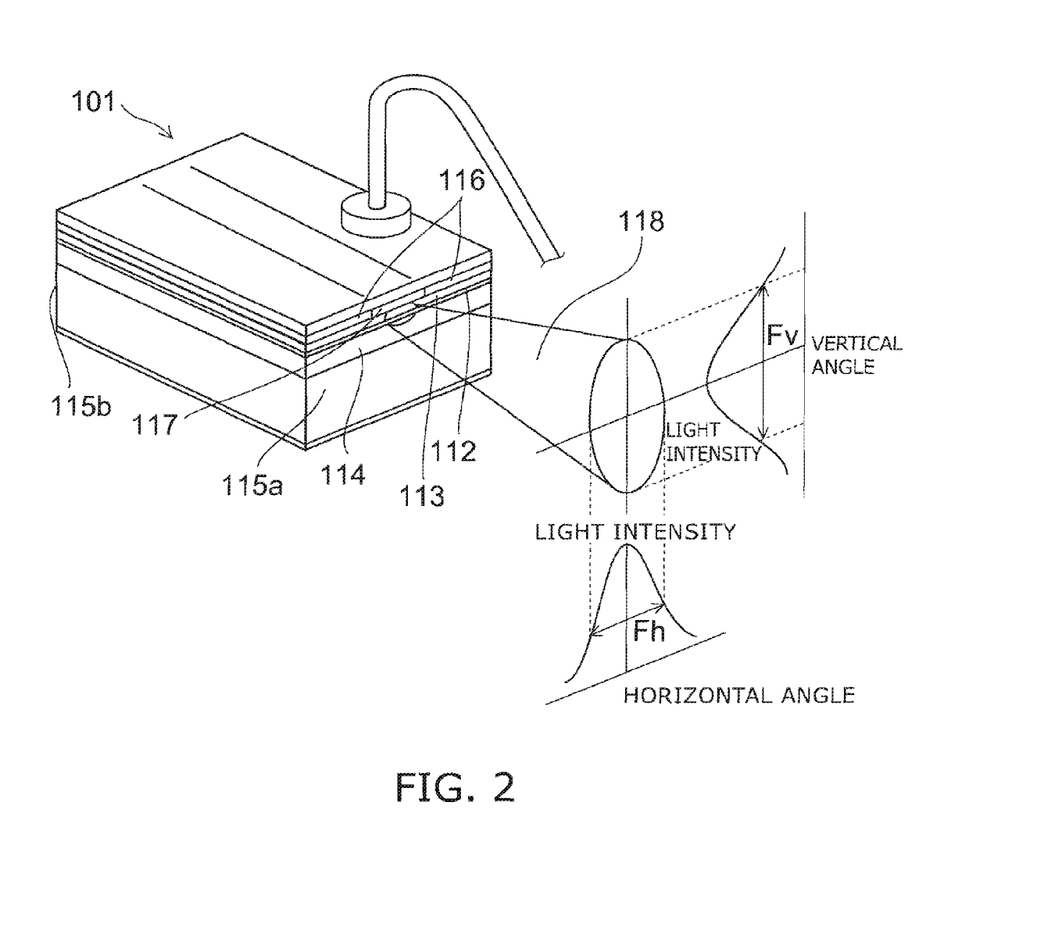
FIG. 2 is a schematic perspective view showing a light emitting element.

FIG. 2 is a schematic perspective view showing the light emitting element.

The light emitting element 101 can be an LED (light emitting diode) or LD (laser diode). In FIG. 2, it is assumed that the light emitting element 101 is an LD 101 capable of narrowing the light distribution angle of its emission light 118. The LD 101 includes an n-type cladding layer 114, an active layer 112, a p-type cladding layer 113, a substrate and the like.

A stripe-shaped resonator 117 sandwiched between insulating films 116 on both sides and having a width of several microns is provided above the p-type cladding layer 113. This results in an index guide structure, which has a light emission area as small as generally 5 μm$^2$ and can achieve high light emission efficiency. This structure makes it possible to control and stabilize the FFP (far field pattern) of the emission light 118 from the cleaved facet (front surface) 115a. The beam spread angle is represented by the angle at which the light intensity is half its maximum. For instance, the vertical beam spread angle Fv with respect to the active layer 12 can be generally 30 degrees, and the horizontal beam spread angle Fh can be generally 10 degrees. Here, increasing the reflectance of the cleaved facet (rear surface) 115b facilitates increasing the optical output from the cleaved facet (front surface) 115a.

In general, the density of light incident on the lens 50 from the light guide 10 can be made generally uniform along the first direction 12 by optimizing the width and depth of the light guide 10 and the FFP of the LD 101. Here, the light emitting element may be a surface-emitting semiconductor element or a solid-state light emitting element with a narrow light distribution angle.

Use of an appropriate convex lens surface in the cross section of the lens 50 facilitates collecting the upward light 118a reflected by the high reflector 15 in the light guide 10 and controlling light distribution characteristics in the plane generally perpendicular to the first direction 12.

Next, control of light distribution characteristics in this embodiment is described in more detail.

Figure 3A:
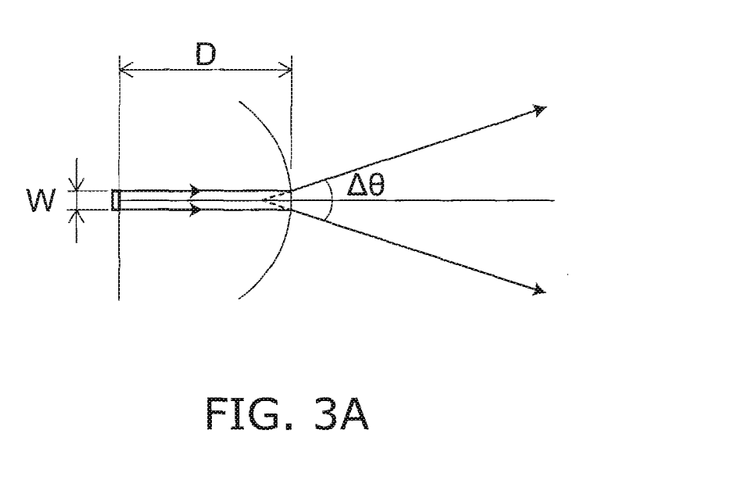
FIGS. 3A and 3B are diagrams for describing an optical path in the cross sections of a light guide and a lens.
Figure 3B:
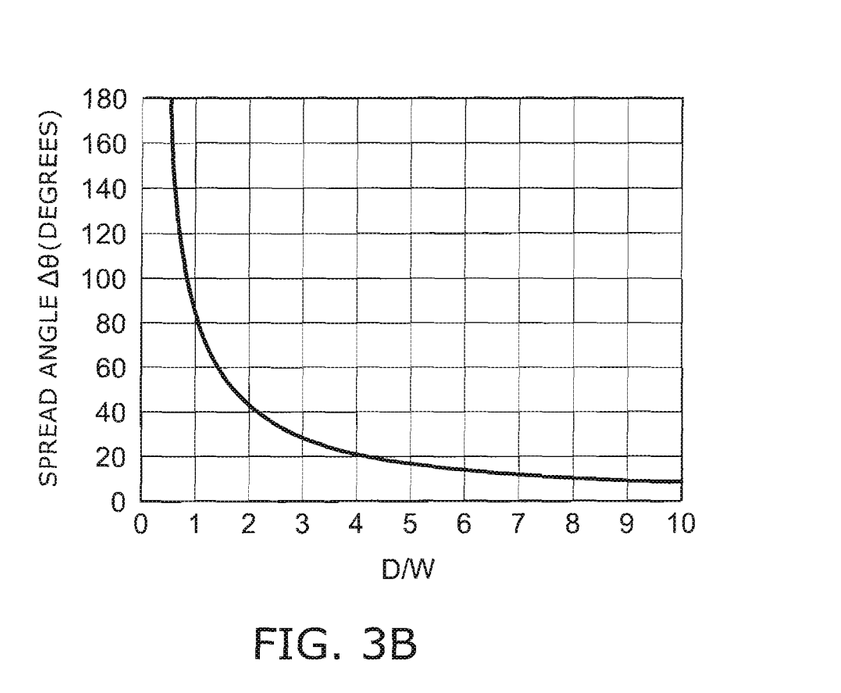

FIG. 3A is a schematic view showing an optical path in the cross section of the light guide and the lens, and FIG. 3B is a graph illustrating the spread angle of light.

The width of the light emitting section of the light emitting element is denoted by W, and the distance between the light emitting section and the lens top is denoted by D. The center of the light emitting section is located immediately below the lens top. Light from the light emitting section is not always incident perpendicular to the tangent at the lens surface. Therefore, the light spreads after exiting the lens. The minimum spread angle of the ray emitted normal from an edge of the light emitting section is denoted by Δθ. That is, it is theoretically difficult to obtain a light distribution angle narrower than Δθ because the light emitting section has a finite width W.

In FIG. 3B, the vertical axis represents the spread angle Δθ (degrees), and the horizontal axis represents D/W. It is found from FIG. 3B that small Δθ requires large D/W. For instance, to narrow Δθ down to 10 degrees, D/W needs to be generally equal to 9, that is, the lens size needs to be increased. In this case, as the width W of the light emitting section is made smaller, the distance D can be decreased, and hence the lens can be downsized. Here, the emission light from the light emitting surface usually includes wider angle rays, and hence D/W is preferably much larger than 9.

In the case of narrowing the light distribution angle in one direction, the lens can be downsized if the width of the light emitting section is narrowed. In the case of using a microlens as this lens, a width less than approximately 5 mm looks narrower than the size of the conventional lens (It is usually wider than 1 cm.). That is, preferably, the light emitting section has a width less than approximately 0.5 mm.

Figure 4A:
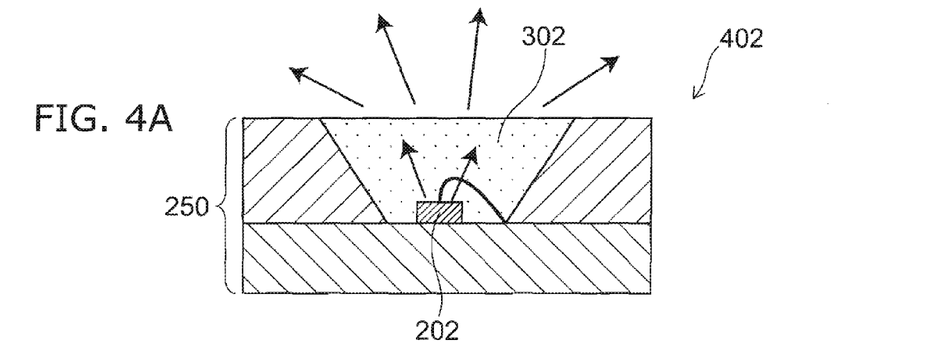
FIGS. 4A to 4C are schematic views of a light emitting device according to a comparative example.
Figure 4B:
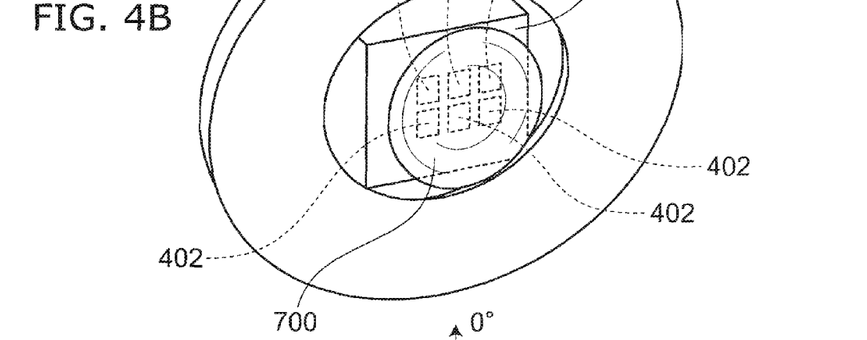
Figure 4C:
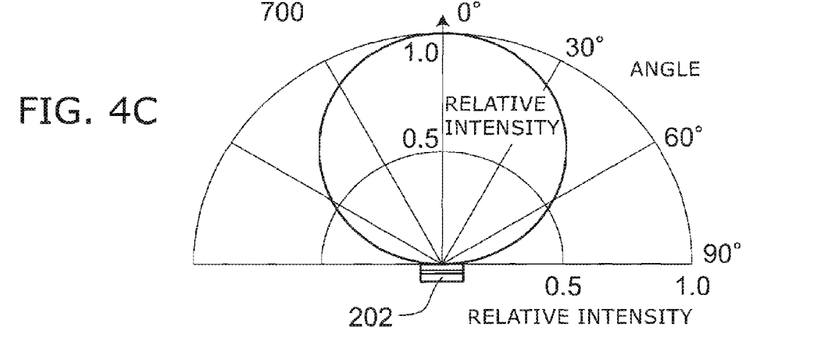

FIG. 4A is a schematic cross-sectional view of a light emitting device according to a comparative example, FIG. 4B is a schematic perspective view of a lighting fixture based thereon, and FIG. 4C shows the light distribution characteristics of a light emitting element chip.

A light emitting element chip 202 capable of emitting blue light is adhered to a mounting member 250, and a phosphor-mixed resin layer 302 is provided thereabove. The angular light distribution characteristic of the light emitting element chip 202 is Lambertian as shown in FIG. 4C, with the full angle at half maximum being as wide as generally 120 degrees×120 degrees. To achieve high brightness with an operating current of 200 mA or more, the chip size is illustratively 1 mm×1 mm. This is because applied current density must be reduced for efficient emission. FIG. 4B shows a lighting fixture, which uses a reflector 600 and a lens 700 to collect and emit six beams of emission light from the light emitting devices 402. The light emitting section in the lighting fixture composed of six light emitting devices has a large size.

For a light distribution angle with a full angle at half maximum of 15 degrees, D/W is generally 5.5 if the full angle at half maximum is regarded as Δθ in FIGS. 3A and 3B. In fact, the emission light includes wider angle components, and hence D/W is set to generally 10 or more. Thus, for a light emitting element with a size of 1 mm×1 mm, it is preferable that the optical system be generally ten times as large, with a size of approximately 1 cm×1 cm. For six chips, an optical system with an even larger size is needed. For instance, the light distribution angle needs to be narrowed utilizing the gigantic reflector 600 and the huge lens 700. That is, the size of the reflector 600 and the lens 700 increases. This results in increasing the size of the light emitting device and also increasing its weight. Thus, it is difficult to move the light emitting device by an small-size, low power-consumption actuator and the like to control light distribution characteristics.

In contrast, in this embodiment in which the width of the light emitting section is easily narrowed, the optical section 35 is easily downsized and slimmed down. As described later, this facilitates controlling the light distribution characteristics of the optical section 35 by further including an actuator and the like.

In this embodiment, if the light emitting element 101 is made of an InGaAlP-based, GaAlAs-based or other material, it can emit visible light at a light emission wavelength in the range of, for instance, 500 to 750 nm. In this specification, the "InGaAlP-based" material refers to a material represented by the composition formula $In_x(Ga_yAl_{1-y})_{1-x}P$ (where $0 \leqq x \leqq 1$, $0 \leqq y \leqq 1$) and also includes those doped with p-type or n-type impurity. Furthermore, the "GaAlAs-based" material refers to a material represented by the composition formula $Ga_xAl_{1-x}As$ ($0 \leqq x \leqq 1$) and also includes those doped with p-type or n-type impurity.

Alternatively, if the light emitting element 101 is made of an InGaAlN-based material, it can emit ultraviolet to green light at a light emission wavelength of, for instance, 350 to 540 nm. In this specification, the "InGaAlN-based" material refers to a material represented by the composition formula $B_xIn_yGa_zAl_{1-x-y-z}N$ (where $0 \leqq x \leqq 1$, $0 \leqq y \leqq 1$, $0 \leqq z \leqq 1$, $x+y+z \leqq 1$) and also includes those doped with p-type or n-type impurity.

In this embodiment, the light emitting device 5 can further include a phosphor-mixed layer 30 between the light guide 10 and the lens 50. More specifically, the light emitting element 101 is made of an InGaAlN-based material to produce violet to blue emission light 118. The phosphor-mixed layer 30, illustratively including yellow phosphor particles, absorbs the emission light 118 of the light emitting element 101 and emits yellow light as a result of wavelength-conversion 119. The mixture of the emission light and the wavelength-converted light can be controlled to have a white color, incandescent-bulb color and the like. As shown in FIG. 1, the upward light 118a is collected by the lens 50 and emitted as outgoing light G1 with high brightness in a direction generally perpendicular to the first direction 12. Here, alternatively, the phosphor can be a material made of YAG and the like. Then, a white color or incandescent-bulb color can also be obtained as a mixed color of red, green, and blue (the emission light of the light emitting element).

Figure 5A:
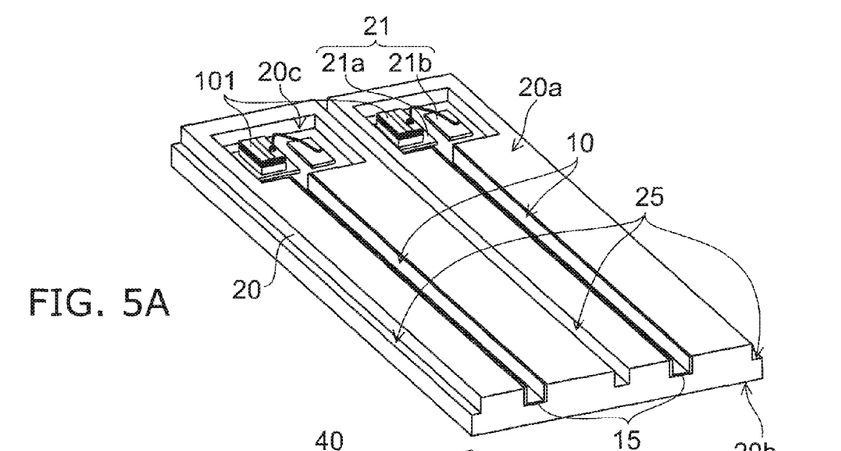
FIGS. 5A to 5C are schematic perspective views illustrating a method for manufacturing a light emitting device.
Figure 5B:
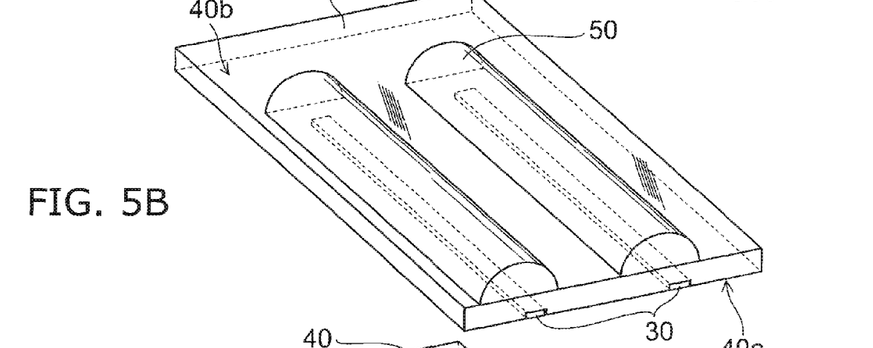
Figure 5C:
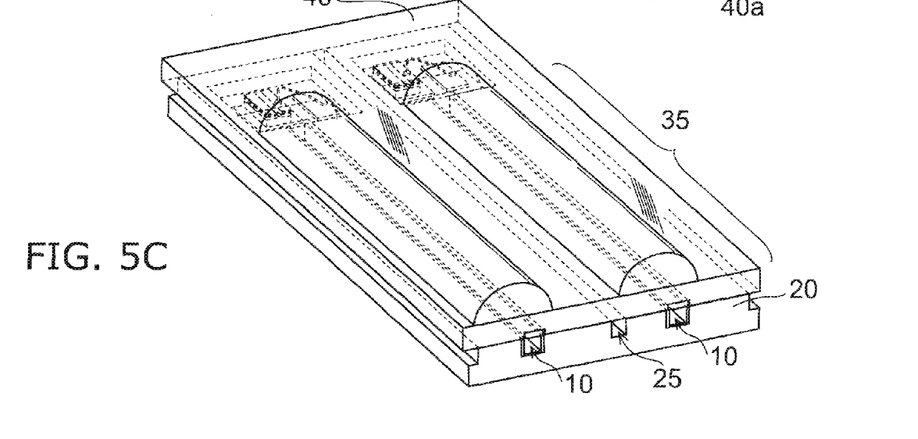

FIGS. 5A to 5C are schematic perspective views illustrating a method for manufacturing a light emitting device according to this embodiment.

On the first major surface 20a side of a substrate 20 illustratively made of Si, a groove-like light guide 10, a recess 20c for mounting and wire-bonding a light emitting element 101, and a groove 25 for separating the substrate 20 are formed by the dry etching method or the we etching method. Thus, the first major surface 20a has difference in level.

On the bottom surface of the recess 20c, a pattern 21a for mounting the light emitting element 101 and a wire bond pad 21b are formed. The electrode pattern 21 is connected to a second major surface 20b of the substrate 20 by a through hole (not shown) and the like. Next, a groove-like light guide 10 having a cross-sectional shape with a width of 500 μm or less, or more preferably 100 μm or less, is formed by the etching process. On the inner wall surface of the light guide 10, Al, Ag or the like may be evaporated to provide a high reflector 15. The light guide 10 provided with the high reflector 15 can guide the emission light from the light emitting element 101 along the first direction 12.

The light emitting element 101 is mounted to the pattern 21a provided on the bottom surface of the recess 20c of the substrate 20 using an AuSn eutectic solder or conductive adhesive, and the electrode of the light emitting element 101 is connected to the pattern 21b by a bonding wire 119 and the like. Thus, the structure of FIG. 5A can be obtained.

On the other hand, a phosphor-mixed layer 30 is formed in a groove provided at a first surface 40a of a transparent substrate 40 illustratively made of glass or resin. The phosphor-mixed layer 30 can be formed illustratively by applying a translucent resin mixed with phosphor particles into the groove and then curing it. If the size of the transparent substrate 40 is matched with the size of the substrate 20, the material can be effectively used, and the productivity is also increased.

The lens 50 is provided on a second surface 40b of the transparent substrate 40 so that its center-line is generally aligned with the center-line of the phosphor-mixed layer 30 as viewed from above, which results in the structure of FIG. 5B. Here, the lens 50 can be formed on the second surface 40b side of the transparent substrate 40 by the etching process or the like. Alternatively, the lens 50 may be formed by the etching or molding process using a lens material whose size is matched with the size of the transparent substrate 40.

Subsequently, a metal pattern (not shown) provided on the substrate 20 is joined with a metal pattern (not shown) provided on the transparent substrate 40 so that the central axis of the lens 50 coincides with the central axis of the light guide 10, and by application of heat or pressure, the structure of FIG. 5C is obtained. By cutting the substrate 20 along the separation groove 25 by the dicing method or scribing method, the individual light emitting device shown in FIG. 1 is completed.

Figure 6:
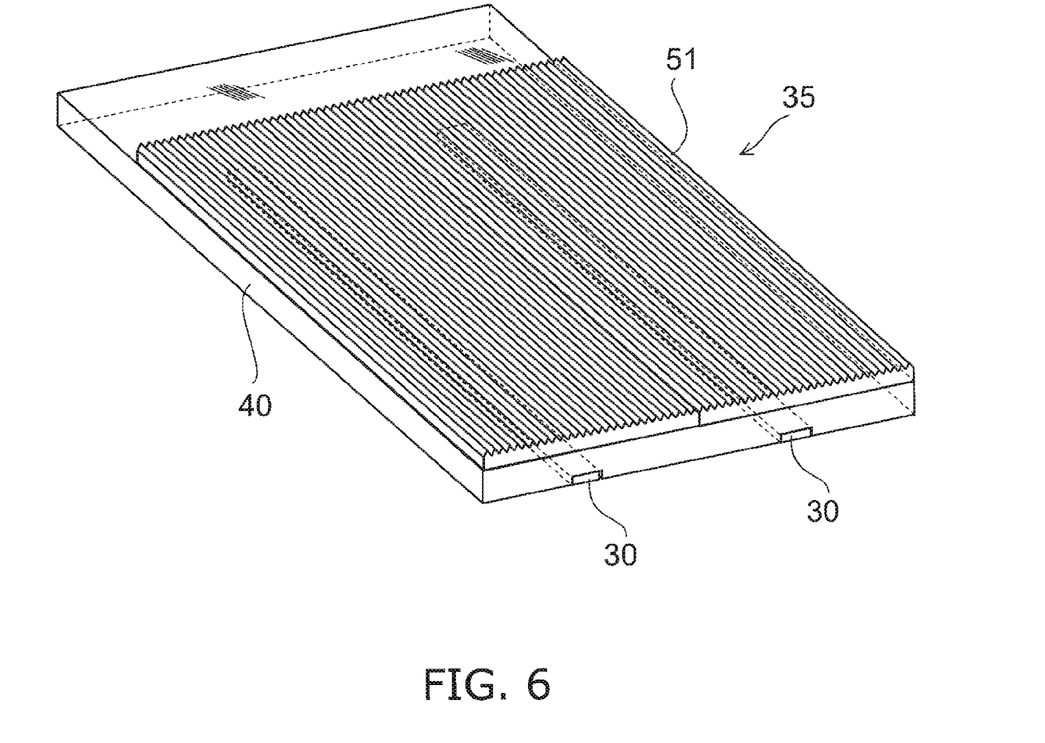
FIG. 6 is a schematic perspective view showing a variation of the lens.

FIG. 6 is a schematic perspective view showing a variation of the lens.

A lens 51 may be provided above the light guide 10 illustratively by laminating on the transparent substrate 40 a micropatterned lens film or prism film having a corrugated cross section.

The manufacturing method of this embodiment is to manufacture a light emitting device at the substrate level and can be referred to as WLP (wafer level packaging). Thus, a small light emitting device can be manufactured with high volume productivity.

Figure 7A:
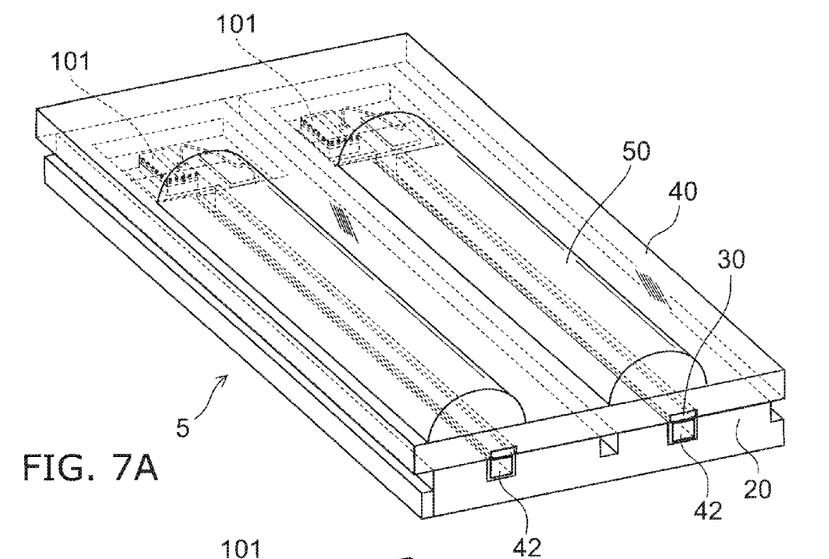
FIGS. 7A and 7B are schematic perspective views of a variation of the first embodiment.
Figure 7B:
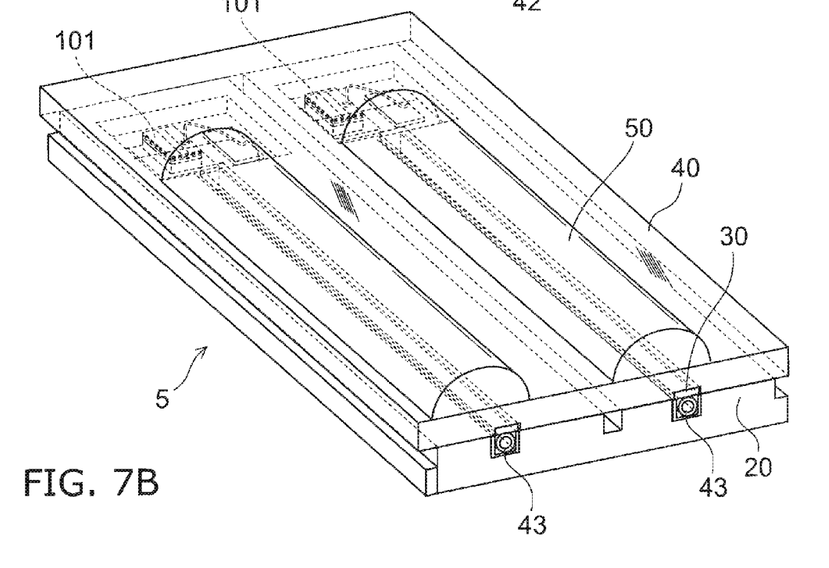

FIG. 7A shows a first variation of the first embodiment, and FIG. 7B shows a second variation thereof.

As shown in FIG. 7A, a glass material 42 having a high refractive index may be packed in the groove-like light guide 10. Alternatively, as shown in FIG. 7B, an optical fiber 43 processed by side surface processing may be packed therein. Furthermore, higher optical functionality can be achieved by using two or more transparent substrates.

Figure 8:
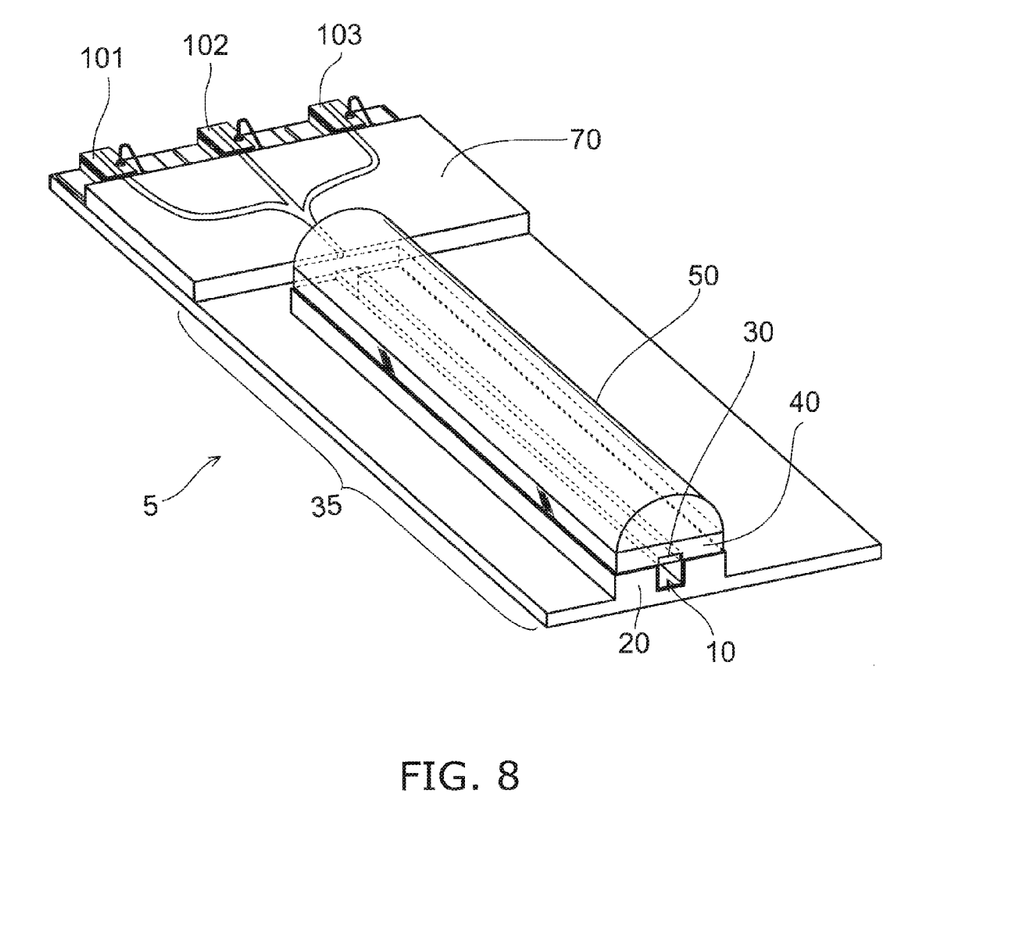
FIG. 8 is a schematic perspective view of a light emitting device according to a second embodiment.

FIG. 8 is a schematic perspective view of a light emitting device according to a second embodiment.

This embodiment includes two or more light emitting elements and an optical combiner 70 such as an optical waveguide coupler. In FIG. 8, three light emitting elements 101, 102, and 103 are provided. The emission lights therefrom are combined by the optical combiner 70 and then injected into the light guide 10. If the three light emitting elements 101, 102, and 103 have a generally equal wavelength, the optical output can be increased, and higher brightness can be achieved.

Figure 9:
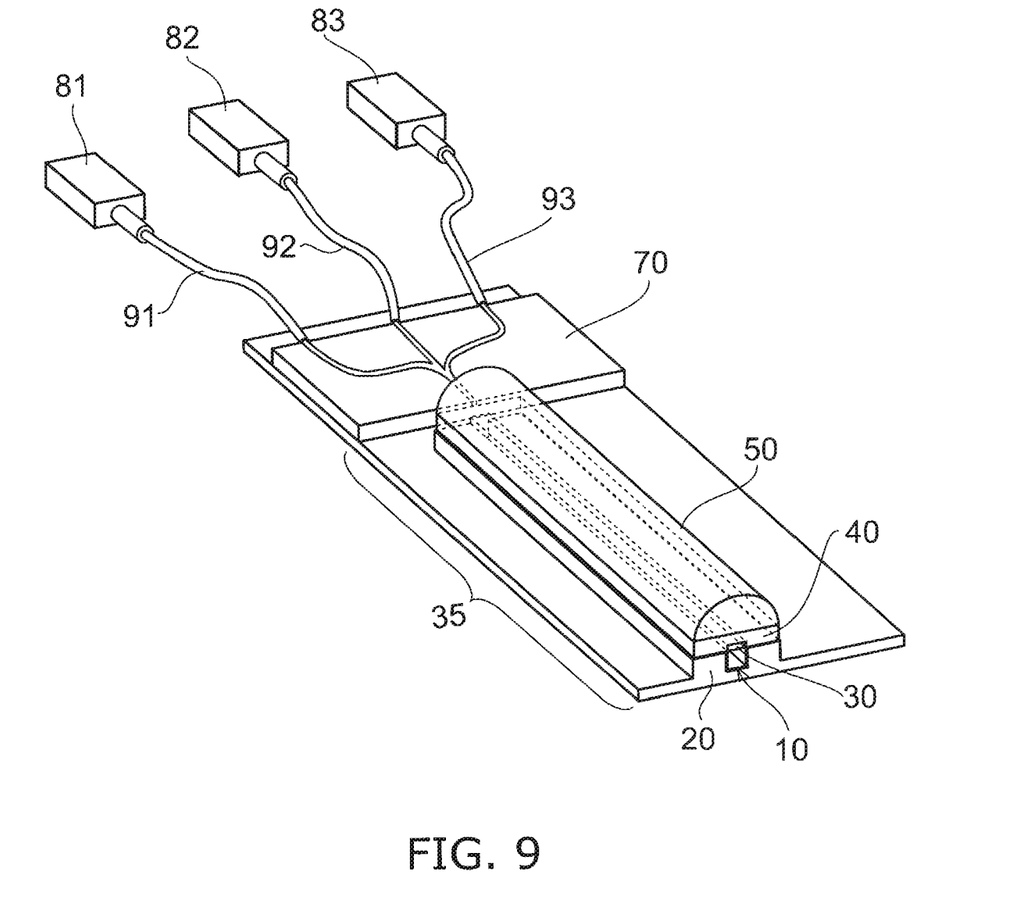
FIG. 9 is a schematic perspective view of a variation of the second embodiment.

FIG. 9 shows a variation of the second embodiment.

Light emitting elements 81, 82, and 83 are mounted respectively on external mounting members. The outputs thereof are injected into the optical combiner 70 respectively through optical fibers 91, 92, and 93 and the like. For instance, if the three light emitting elements 81, 82, and 83 emit red, green, and blue light, respectively, then a mixed color is generated in the light guide 10, and hence the phosphor-mixed layer can be omitted.

Figure 10:
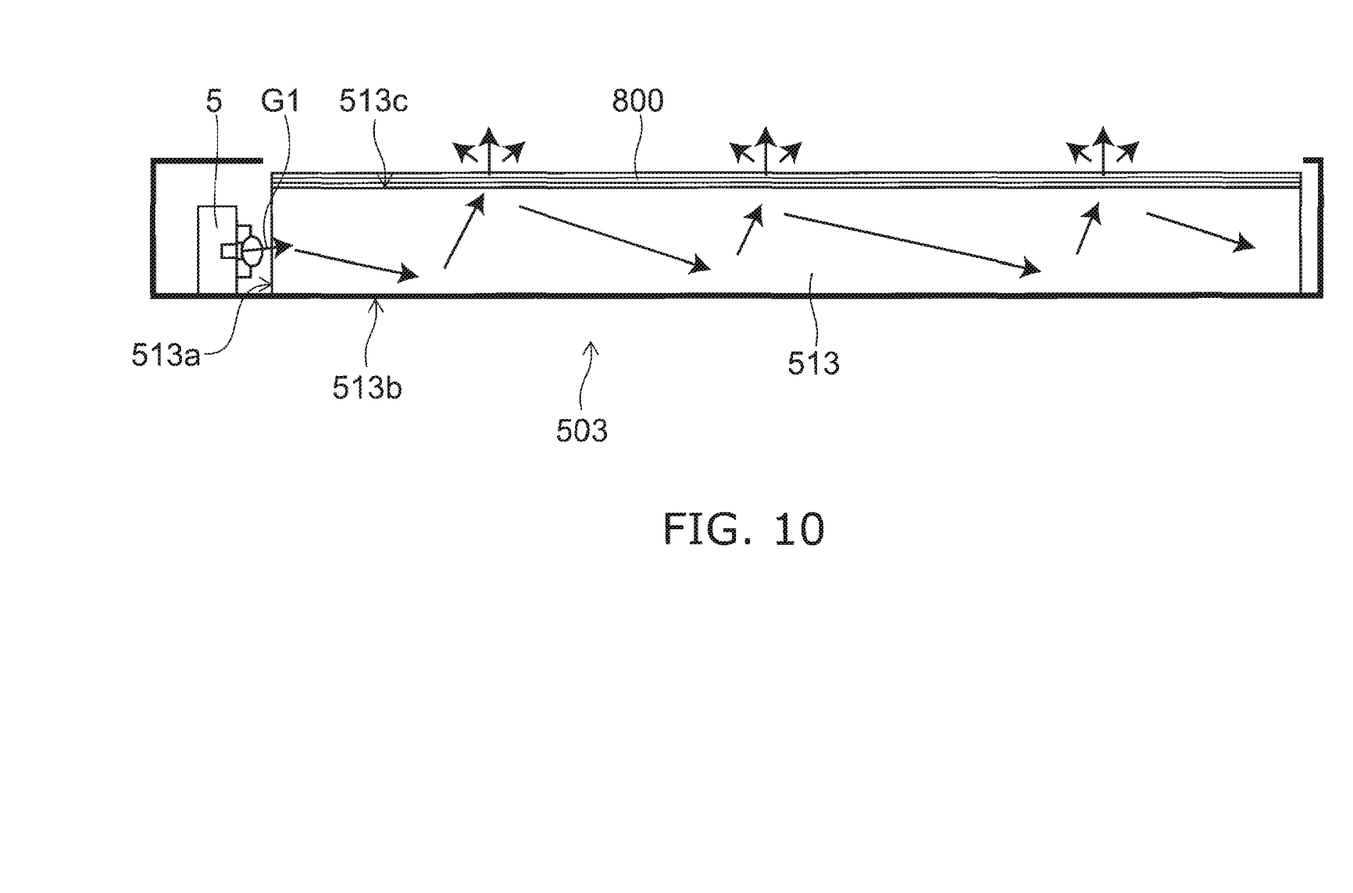
FIG. 10 is a schematic cross-sectional view of a lighting fixture according to a third embodiment.

FIG. 10 is a schematic cross-sectional view of a lighting fixture according to a third embodiment.

The outgoing light G1 from the light emitting device 5 is introduced from a side surface 513a of a light guide plate 513. An optical film stack 800 is provided on the upper surface 513c of the light guide plate 513. The incident light is reflected at the lower surface 513b of the light guide plate 513, and then part of it is introduced and diffused into the optical film stack 800, and then emitted upward. Part of the remaining light is reflected and further travels toward the other side surface of the light guide plate 513. By thus repeating reflection, the entire surface of the optical film stack 800 can be irradiated generally uniformly. For instance, if the width WG of the light emitting section is 100 μm or less, the light distribution angle can be narrowed despite downsizing the lens, which facilitates improving the efficiency of light extraction from the light guide plate 513. Furthermore, the lighting fixture is easily slimmed down. Such a lighting fixture can illustratively be used as the backlight source of a liquid crystal display device.

Figure 11A:
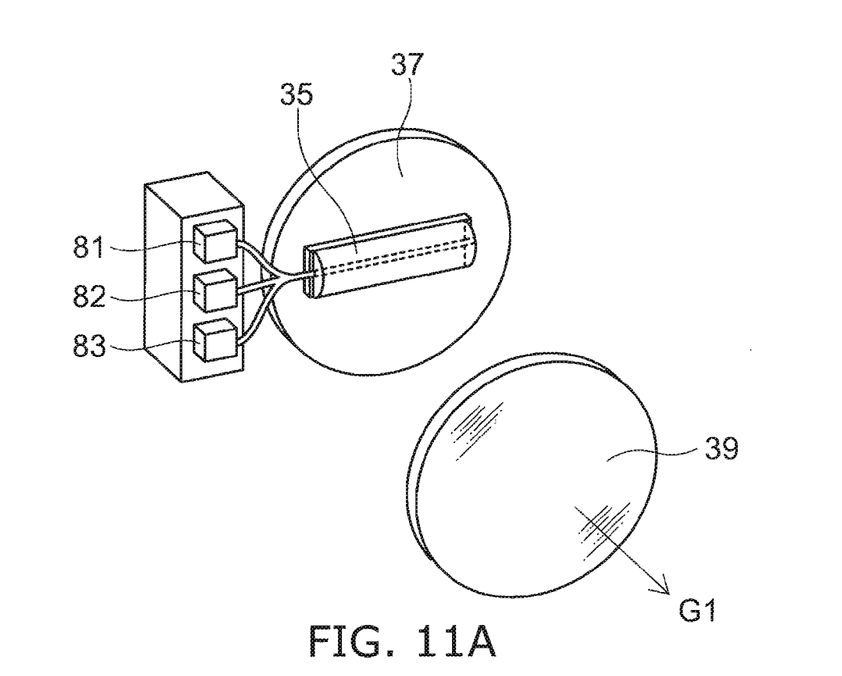
FIGS. 11A and 11B are schematic perspective views of a lighting fixture according to a fourth embodiment.
Figure 11B:
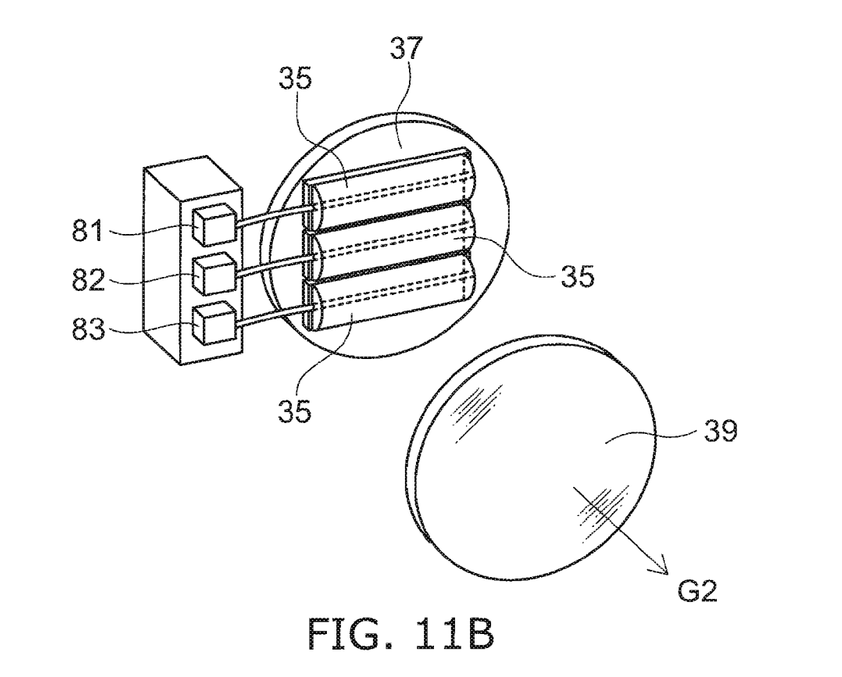

FIG. 11A is a schematic perspective view of a lighting fixture according to a fourth embodiment, and FIG. 11B is a schematic perspective view of a variation thereof.

This embodiment further includes a base 37, and the optical section 35 is attached to the base 37. The emission light from the light emitting elements 81, 82, and 83 separated from the base 37 is introduced into the light guide 10 through optical fibers and the like. Because of the narrow width of the light emitting section, the base 37 and a lamp cover 39 can be downsized and slimmed down. Here, if a reflector function capable of reflecting light is imparted to the surface of the base 37 to which the light emitting section is attached, higher luminance can be achieved. Such a lighting fixture can be used as a car headlight and the like. If the light guide 10 is elongated in the first direction 12, outgoing light G1 from a linear light source with reduced luminance can be obtained.

In the variation of FIG. 11B, three optical sections 35 are placed on the base 37, and the luminance per optical section is weakened. Thus, outgoing light G2 with too high luminance can be obtained while suppressing glare.

Figure 12:
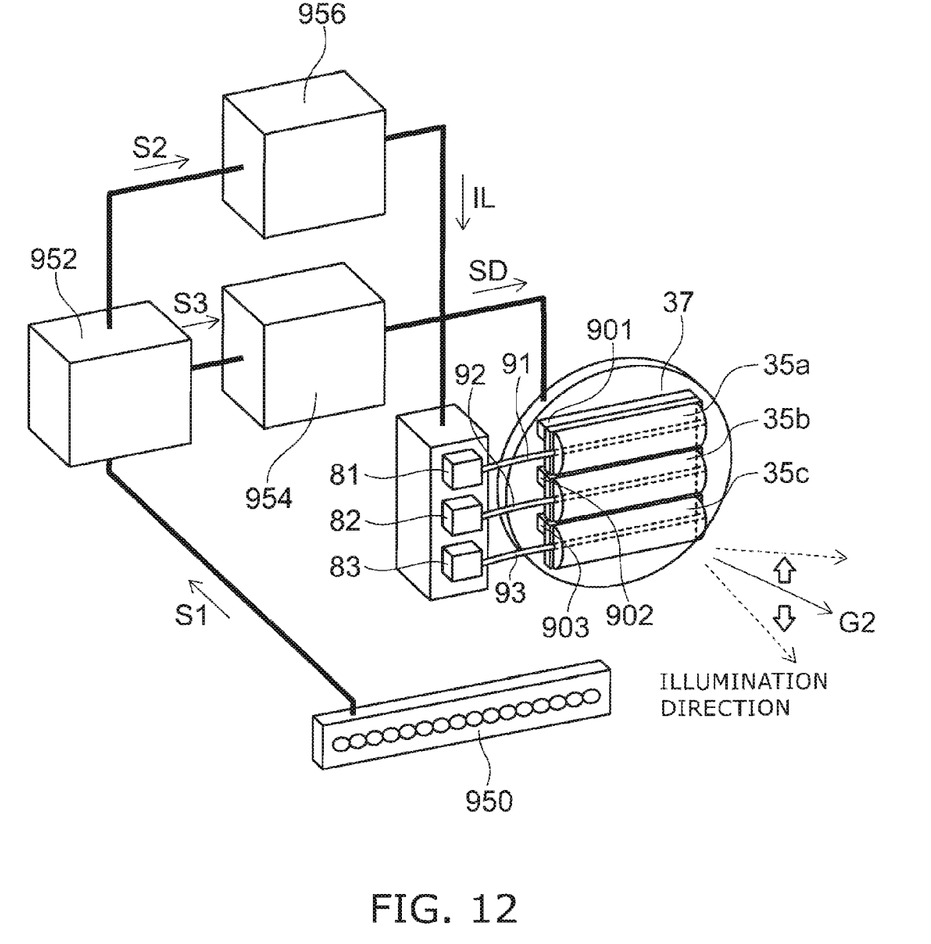
FIG. 12 is a schematic perspective view of a lighting system according to a fifth embodiment.

FIG. 12 is a schematic perspective view of a lighting system according to a fifth embodiment.

This lighting system includes a lighting fixture, actuators 901, 902, and 903, and an actuator driving circuit 954. The lighting fixture is a lighting fixture according to the fourth embodiment shown in FIG. 11B. The second major surface 20b side of the substrate 20 of three optical sections 35a, 35b, and 35c is mounted on the actuators 901, 902, and 903, respectively. The actuators 901, 902, and 903 are connected to the actuator driving circuit 954.

The actuators 901, 902, and 903 mounted on the base 37 are composed of a hydraulic device, small motor, solenoid coil, shape memory alloy, MEMS (Micro-Electro-Mechanical Systems) and the like. The optical sections 35a, 35b, and 35c mounted on the actuators 901, 902, and 903 can be each driven by the actuator driving circuit 954 to vary the tilt angle of the substrate 20. Thus, the illumination direction and combined light distribution characteristics of the outgoing light G2 can be controlled. Although the light emitting element can be mounted on the actuator, the actuator then grows in size, causing degradation of its driving characteristics and increase in driving power. As shown in FIG. 12, separation of the light emitting elements 81, 82, and 83 from the optical sections 35a, 35b, and 35c, respectively, facilitates driving the optical sections 35. Here, the lighting fixture may be a lighting fixture according to the third embodiment shown in FIG. 10.

This lighting system can further include a control circuit 952 and a sensor 950. The sensor 950 illustratively includes a CCD or other imaging element and detects the image of an object irradiated with the outgoing light G2 from the lighting fixture. The image signal S1 of the sensor 950 is inputted to the control circuit 952 composed of an MPU (microprocessing unit) and the like, and is analyzed.

In accordance with the driving signal SD outputted from the actuator driving circuit 954, the actuators 901, 902, and 903 can control the illumination direction of the outgoing light G2 from the optical sections 35a, 35b, and 35c, respectively.

A light emitting element control signal S2 from the control circuit 952 based on the image analysis result is inputted to a light emitting element power supply circuit 956, which can controllably supply a current IL to each of the light emitting elements 81, 82, and 83.

In the case of using such a lighting fixture for a car headlight, the control signal 952 can analyze images and output, to the light emitting element power supply circuit 956, a light emitting element control signal S2 for varying the luminance of the outgoing light G2 to the oncoming car or pedestrian. For instance, when it is determined that the luminance is too high, current IL to the light emitting element can be reduced.

Furthermore, the control signal 952 outputs an actuator control signal S3 for varying the illumination direction of the outgoing light G2 to the actuator driving circuit 954. For instance, when it is judged to avoid the direct illumination to the oncoming car or pedestrian, the illumination direction is varied. This facilitates suppressing glare for the oncoming car or pedestrian.

Furthermore, by using two actuators, a first light distribution characteristic and a second light distribution characteristic can be combined, and the overall light distribution characteristics can be controlled. Here, the control direction of illumination is not limited to the vertical direction, but can be the horizontal direction.

This embodiment facilitates implementing a sophisticated system such as an AFS (adaptive front-lighting system). For instance, the light distribution characteristics can be controlled in synchronization with the steering and turn signal. Furthermore, at a corner, when glare to the oncoming car is anticipated, the light can be temporarily turned off and then turned on again by automatic control. Furthermore, in accordance with the driving speed, the luminance and light distribution characteristics can be automatically controlled.

The first and second embodiments and the variations associated therewith provide a light emitting device, which can easily achieve high brightness while keeping the optical system small, and a method for manufacturing the same.

The third embodiment provides a lighting fixture applicable to a small and high-brightness backlight source and the like, in which the light distribution characteristic is easily controlled.

The fourth embodiment provides a lighting fixture applicable to a small and high-brightness headlight and the like, in which the light distribution characteristic is easily controlled.

Furthermore, the fifth embodiment provides a lighting system applicable to an AFS and the like, in which the illumination direction and light distribution characteristic are easily controlled.

The method for manufacturing a light emitting device of this embodiment can be of the WLP type by using a Si substrate and the like, and hence high volume productivity can be achieved. This consequently facilitates cost reduction.

Hereinabove, the embodiments of the invention have been described with reference to the drawings. However, the invention is not limited to these embodiments. Those skilled in the art can variously modify the material, shape, size, layout and the like of the light emitting element, substrate, waveguide, phosphor-mixed layer, transparent substrate, lens, light guide plate, optical sheet, actuator, sensor and the like constituting the embodiments, and such modifications are also encompassed within the scope of the invention.

The invention claimed is:

1. A light emitting device comprising:
a light emitting element;
a substrate including a light-guiding groove which guides light and extends along a first direction, emission light emitted from the light emitting element and introduced into the light-guiding groove being reflected by an inner wall surface of the light-guiding groove, spreading along the first direction, and being turned into upward light directed upward above the substrate;
a lens provided above the light-guiding groove and configured to collect the upward light and control light distribution characteristic in a plane generally perpendicular to the first direction;
a transparent substrate provided between the substrate and the lens and having a groove opposed to the light-guiding groove;
a phosphor-mixed layer provided between the substrate and the lens and capable of absorbing the emission light and emitting wavelength-converted light, the phosphor-mixed layer being provided in the groove of the transparent substrate;
the lens further collecting the wavelength-converted light and controlling light distribution characteristic of mixed light of the upward light and the wavelength-converted light in the plane generally perpendicular to the first direction.

2. The device according to claim 1, wherein the substrate has a high reflector on the inner wall surface of the light-guiding groove.

3. The device according to claim 1, wherein the light emitting element is a light emitting diode or a laser diode.

4. The device according to claim 1, wherein the lens has a corrugated cross section.

5. The device according to claim 1, further comprising: an optical combiner, the light emitting element including: a first light emitting element having a first light emission wavelength; and a second light emitting element having a second light emission wavelength different from the first light emission wavelength, emission light from the first light emitting element and emission light from the second light emitting element being combined by the optical combiner into mixed light, and the mixed light being introduced into the light-guiding groove.

6. The device according to claim 1, further comprising: an optical fiber provided in the light guide of the substrate, the emission light from the light emitting element being introduced into the light-guiding groove via the optical fiber.

7. A lighting system comprising: a lighting fixture including: a light emitting device including:
a light emitting element;
a substrate including a light-guiding groove which extends along a first direction, emission light emitted from the light emitting element and introduced into the light-guiding groove being reflected by an inner wall surface of the light-guiding groove, spreading along the first direction, and being turned into upward light directed upward above the substrate; and
a lens provided above the light-guiding groove and configured to collect the upward light and control light distribution characteristic in a plane generally perpendicular to the first direction;
an actuator configured to vary tilt angle of the substrate; and
an actuator driving circuit configured to drive the actuator; a sensor capable of detecting an image of an object irradiated with outgoing light from the lens, a light emitting element power supply circuit configured to supply a current to the light emitting element; and a control circuit configured to use the detected image to output to the light emitting element power supply circuit a light emitting element control signal for controlling the current and to output to the actuator driving circuit an actuator control signal for controlling illumination direction of the outgoing light.

8. The lighting system according to claim 7, wherein the actuator includes a first actuator and a second actuator, and a first light distribution based on the first actuator and a second light distribution based on the second actuator are combined.

9. A lighting system comprising: a lighting fixture including:

a light emitting device including;

a light emitting element;

a substrate including a light-guiding groove which along a first direction, emission light emitted from the light emitting element and introduced into the light guide being reflected by an inner wall surface of the light guide, spreading along the first direction, and being turned into upward light directed upward above the substrate;

a phosphor-mixed layer provided above the light-guiding groove and capable of absorbing the emission light and emitting wavelength-converted light; and a lens provided above the phosphor-mixed layer and configured to collect the upward light and the wavelength-converted light and control light distribution characteristic of mixed light of the upward light and the wavelength-converted light in the plane generally perpendicular to the first direction;

an actuator configured to vary tilt angle of the substrate; and an actuator driving circuit configured to drive the actuator;

a sensor capable of detecting an image of an object irradiated with outgoing light from the lens;

a light emitting element power supply circuit configured to supply a current to the light emitting element; and a control circuit configured to use the detected image to output to the light emitting element power supply circuit a light emitting element control signal for controlling the current and to output to the actuator driving circuit an actuator control signal for controlling illumination direction of the outgoing light.

10. The lighting system according to claim 9, wherein the actuator includes a first actuator and a second actuator, and a first light distribution based on the first actuator and a second light distribution based on the second actuator are combined.

11. A method for manufacturing a light emitting device, comprising:

forming a electrode pattern, light-guiding groove, and a separation groove on a wafer-like substrate;

mounting a light emitting element to the wafer-like substrate to electrically connect an electrode of the light emitting element and the electrode pattern, emission light of the light emitting element being capable of being introduced into the light-guiding groove;

forming a phosphor-mixed layer on a first major surface of a transparent substrate and providing a lens on a second major surface side of the transparent substrate opposite to the first major surface;

laminating the wafer-like substrate to the first major surface side of the transparent substrate to make the light-guiding groove opposite to the phosphor-mixed layer; and cutting and separating the wafer-like substrate and the transparent substrate along the separation groove.

\* \* \* \* \*